United States Patent [19]

Bhargava et al.

[11] Patent Number: 5,106,828
[45] Date of Patent: Apr. 21, 1992

[54] METHOD FOR FABRICATING SUPERCONDUCTORS BY SOL-GEL PROCESS

[75] Inventors: Rameshwar N. Bhargava, Ossining, N.Y.; William N. Osborne, Ringwood, N.J.; Walter K. Zwicker, Scarborough, N.Y.

[73] Assignee: North American Philips Corporation, New York, N.Y.

[21] Appl. No.: 75,491

[22] Filed: Jul. 20, 1987

[51] Int. Cl.$^5$ ............... B05D 5/12; H01L 39/12; C01B 15/04; C04B 35/05

[52] U.S. Cl. ............... 505/1; 505/734; 505/735; 427/62; 427/63; 427/226; 423/263; 423/593; 423/604; 501/152; 252/521

[58] Field of Search ............... 505/1, 734, 735; 427/62, 63, 226; 423/583, 593, 263; 501/152

[56] References Cited

U.S. PATENT DOCUMENTS 4,606,906  8/1986  Ritter et al. ............... 501/136

OTHER PUBLICATIONS

Barboux et al., Preprint-Journal of Applied Physics.
Dislich, *J. of Non-Crystalline Solids*, 57(1983), pp. 371-388.
Fujiki et al, *Jap. J. of App. Phys. Lett.*, vol. 26, No. 7, Jul. 1987, pp. L1159-1160.
Uchida et al., *Jap. J. of App. Phys. Lett.*, vol. 26, No. 1, Jan. 1987, pp. L1-L2.
Mackenzie, from *Ultrastructure Processing of Ceramics, Glasses, and Composites*, Hench & Ulrich, Ed., (Wiley, N.Y.), c. 1984, pp. 15-26.

Primary Examiner—Norman Morgenstern
Assistant Examiner—Margaret Burke
Attorney, Agent, or Firm—John C. Fox

[57] ABSTRACT

Superconducting oxides in the A, B, Cu oxide ternary system, where A is yttrium or a rare earth and B is an alkaline earth, are formed as thin films on a substrate by a sol-gel technique.

15 Claims, 3 Drawing Sheets

METHOD FOR FABRICATING SUPERCONDUCTORS BY SOL-GEL PROCESS

BACKGROUND OF THE INVENTION

This invention relates to a sol-gel technique for producing superconducting oxides, and to thin films of superconducting oxides produced by the technique.

Recently, renewed interest in superconductors was kindled by the discovery of superconductivity at about 30K in compounds in the barium-lanthanum-copper-oxygen system. J. G. Bednorz and K. A. Muller, Z. Phys. B., Vol. 64, No. 189, March 1986. The highest temperature previously observed for the onset of superconductivity had been 23.2K for the intermetallic compound $Nb_3Ge$.

Intensive research conducted after the Bednorz-Muller announcement has resulted in dramatic increases in Tc, the critical temperature at which the onset of superconductivity occurs. For example, superconductivity above 90K has very recently been reported in the square planar compound system $ABa_2Cu_3O_{6+x}$, where A is yttrium or a rare earth, by P. H. Hor et al., Phys. Rev. L., Vol. 58, No. 18, May 4, 1987; and superconductivity at 155K has most recently been reported in a multiphase material of the nominal composition $YBa_2Cu_3F_2O_y$, by S. R. Ovshinsky et al., Phys. Rev. L., Vol. 58, No. 24, June 15, 1987.

While these dramatic developments presage a host of new applications using these new superconductors, many practical problems remain to be solved before successful commercialization of these applications can be realized.

For example, the new "high temperature" superconductors are essentially ceramic oxides, and their fabrication into certain shapes such as thin films is difficult or impossible to achieve by conventional ceramic processing techniques. Moreover, conventional techniques do not allow the close control over composition, morphology and phase formation which have been found necessary for the successful production of these high temperature superconducting oxides. Thus, the mixing together of starting materials followed by firing the mixture at elevated temperatures to form the superconducting compound by solid state reaction results in a fired composition whose homogeneity will be largely determined by the intimacy of mixing of the starting materials, which is limited by the particle size of these starting materials. Such inhomogeneity, as well as loss of material through volatilization and diffusion of impurities from surrounding structures enabled by the high reaction temperatures, may interfere with the obtaining of the desired superconducting phase.

Furthermore, while solid state reaction usually results in some densification of the particulate starting mixture, final densities near theoretical are rarely obtained, except by resort to extraordinary measures such as hot pressing. High density is thought to be important in superconducting films because it maximizes the number of paths available for conductivity of electrons through the material.

Various techniques other than conventional powder processing techniques have been disclosed for producing mixed oxide ceramics and glasses. For example, in British patent 1,266,494, mixed oxide microspheres are formed by dispersing an aqueous metal salt solution in a non-miscible organic liquid, and adding a base to induce gelling of the dispersed aqueous phase by hydrolysis. The gelled particles are then separated from the organic phase and heated to effect solid state reaction.

In U.S. Pat. No. 4,278,632, silica-titania binary glasses are formed on a substrate by: first partially hydrolyzing one metal alkoxide by adding water to a dilute organic solution of the alkoxide; then reacting this solution with another metal alkoxide solution to polymerize the reactants; then coating the solution on a substrate; drying the coating; and heating the coating at a temperature of about 400 to 1000 degrees C. to convert the coating to a glass. Similar techniques for glass formation are disclosed in U.S. Pat. Nos. 4,472,510; 4,420,517 and 4,419,115. However, none of these patents suggests that their processes can be used to make superconducting materials.

In co-pending U.S. patent application Ser. No. 812,219, filed Febr. 10, 1986 and assigned to the present assignee Ser. No. 812,219, there is described a sol-gel process in which a gellable liquid of partly hydrolyzed alkoxides is applied to a substrate, gelled and heated to form a luminescent thin film. However, such luminescent materials do not require the close control over composition, morphology and phase formation which have been found necessary for the successful production of high temperature superconducting oxides.

Accordingly, it is a principal object of the invention to produce dense, homogeneous thin films of high temperature superconducting oxide compositions.

It is another object of the invention to provide a method for producing superconducting oxides which enables close control over the composition, morphology and phase formation of such films.

It is a still further object of the invention to provide a sol-gel process for producing superconducting oxides.

SUMMARY OF THE INVENTION

In accordance with the invention, a high temperature superconducting oxide is formed by a sol-gel process in which:

1) a sol is formed from a solution of hydrolyzable alkoxides in a volatile, non-polar solvent, the alkoxides being precursors of the desired oxide constituents of the film and being present in the stoichiometric proportions needed to yield the desired superconducting composition;

2) the sol is gelled by hydrolysis and polymerization of the alkoxides; and 3) the gel is heated in the presence of oxygen to promote the formation of the desired superconducting phase.

Such a sol-gel process, by combining starting constituents in solution, achieves homogeneous mixing essentially on a molecular scale, thus avoiding the particle-related limitations of conventional powder processing techniques.

Such intimate mixing is felt to be particularly advantageous in the formation of superconducting thin films, since it enables the production of dense, crystalline films of uniform stoichiometry. The homogeneity of the sol insures that the starting composition will have the desired uniform stoichiometry. In addition, the possibility of impurity introduction through particle comminution and mixing, as well as the inherent porosity associated with powder mixtures and compacts, are avoided.

During the process of gelation, enabled by the evaporation of the solvent, hydrolysis of the alkoxides (usually achieved by exposure to ambient moisture), initiates a polymerization reaction in which cation-oxygen-cation linkages are formed. These linkages are believed to be advantageous in the subsequent formation of the superconducting phase.

In accordance with a preferred embodiment of the sol-gel process of the invention, the superconducting oxide is formed as a thin film on a substrate. The desired film thickness can be obtained by controlling the viscosity of the sol, as well as by building up the film with multiple layers. In addition, the sol-gel process enables the production of films having planar upper surfaces regardless of substrate profile, which may be advantageous in the formation of multilayer structures such as integrated circuits.

As used herein, the term "thin film" means a film having a thickness of from about 1 to 100 microns, typically from about 1 to 10 microns.

As used herein, the term "high temperature superconducting oxide" means an oxide composition which exhibits superconductivity at a temperature of 80K or above. Such compositions are known to occur in the ternary oxide system for A, B and Cu oxides, where A is yttrium or a rare earth, and B is an alkaline earth, such as barium or strontium. One example of such a composition is $YBa_2Cu_3O_{6+x}$. In addition to oxygen, other anions such as fluorine may be present. It is expected that other high temperature superconducting oxide compositions will be discovered, and it is to be understood that the advantages of the sol-gel process described herein apply to such compositions.

DESCRIPTION OF THE PREFERRED EMBODIMENTS

Figure 1:
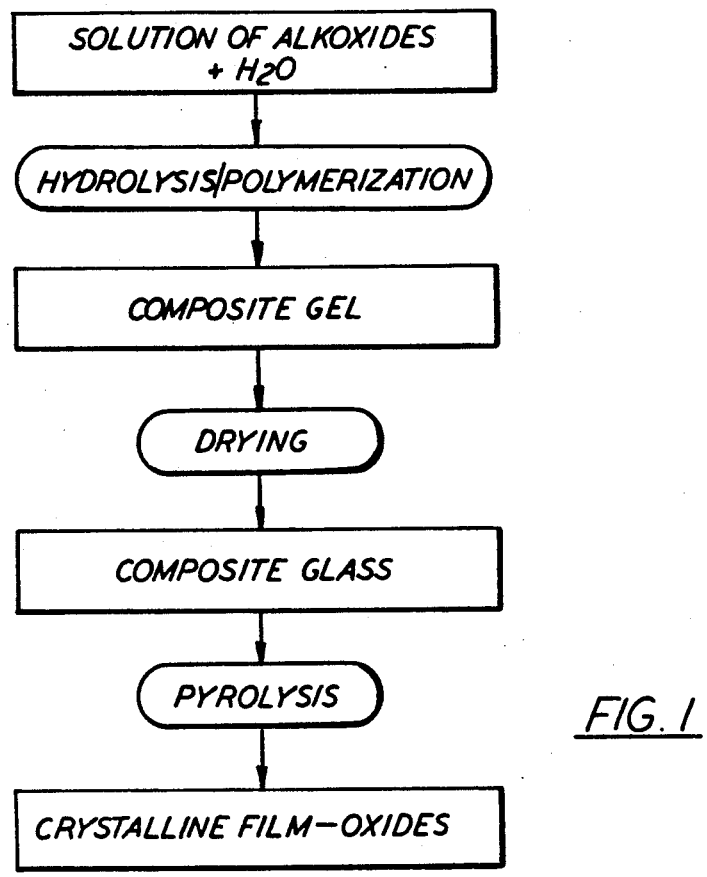
FIG. 1 is a block flow diagram illustrating the steps involved in the formation of a superconducting oxide thin film by the sol-gel process of the invention.

Referring now to FIG. 1, which is a block flow diagram illustrating the steps involved in producing a superconducting crystalline oxide thin film from a solution of alkoxides, the first step shown is the addition of water to the solution, (typically by exposure of the solution to a moist ambient) to promote hydrolysis and initiate polymerization of the alkoxides, whereby first a sol and then a composite gel is formed. In forming the starting solution, a separate compound is chosen for each cation desired to be present in the film, the compound either being an alkoxide or being capable of forming an alkoxide in solution, the alkoxide having mutual solubility with the other alkoxides in a non-polar, volatile solvent such as an alcohol. Such mutual solubility is essential to prevent precipitation of one or more constituents out of the solution prior to formation of the composite gel.

Immediately upon formation of the solution, it will generally begin to form to a sol due to partial hydrolysis of the alkoxide compounds. Such partial hydrolysis is typically accompanied by an increase in viscosity, which is acceptable so long as the ability to form the sol into a thin film is not substantially reduced.

Subsequent formation of the sol into a thin film, such as by spreading, brushing, screen printing, dipping, spraying, etc., will allow removal of the solvent by evaporation, and the continuation of the hydrolysis of the alkoxides.

While the rate of evaporation and hydrolysis may be controlled by various techniques such as elevating the temperature and/or passing a stream of gas containing a controlled amount of water vapor over the film, simply locating the film in an uncontrolled ambient environment containing water vapor has been found to be generally sufficient for the achievement of an integral, adherent gelled film.

This gelled film may contain residual amounts of solvent, water and other volatile constituents which may be driven off by moderate heating, for example, at a temperature of from about 150 to 300 degrees C., to result in a non-crystalline dried film referred to herein as composite glass. This composite glass is then pyrolyzed or fired, that is, heated at a moderately higher temperature, for example, from about 700 to 1,000 degrees C., in the presence of oxygen in order to convert the composite glass to a superconductive crystalline oxide film.

Figure 2:
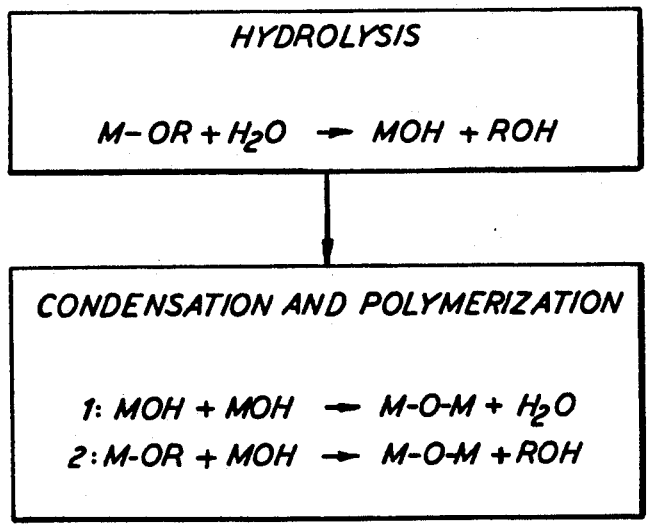
FIG. 2 is a block flow diagram illustrating the chemical changes occurring in a thin film of a sol of the invention during hydrolysis and polymerization.

Referring now to FIG. 2, another block flow diagram, the chemical reactions which take place during hydrolysis and subsequent condensation and polymerization are illustrated. As is known, during hydrolysis alkoxide molecules, represented by M-OR, where M is a cation, O is oxygen and R is an organic radical, react with water molecules to form two hydroxyls, one associated with the cation M and the other associated with the organic radical R.

During subsequent condensation and polymerization, two possible reactions may take place. In one reaction, the inorganic hydroxide molecules formed from the cations react together to form cation-oxygen-cation linkages plus water. In the other reaction, unreacted alkoxide molecules react with inorganic hydroxide molecules to also form cation-oxygen-cation linkages plus alcohol molecules. These cation-oxygen-cation linkages are believed to be advantageous in the formation of the crystalline thin films having a superconducting phase.

Figure 3:
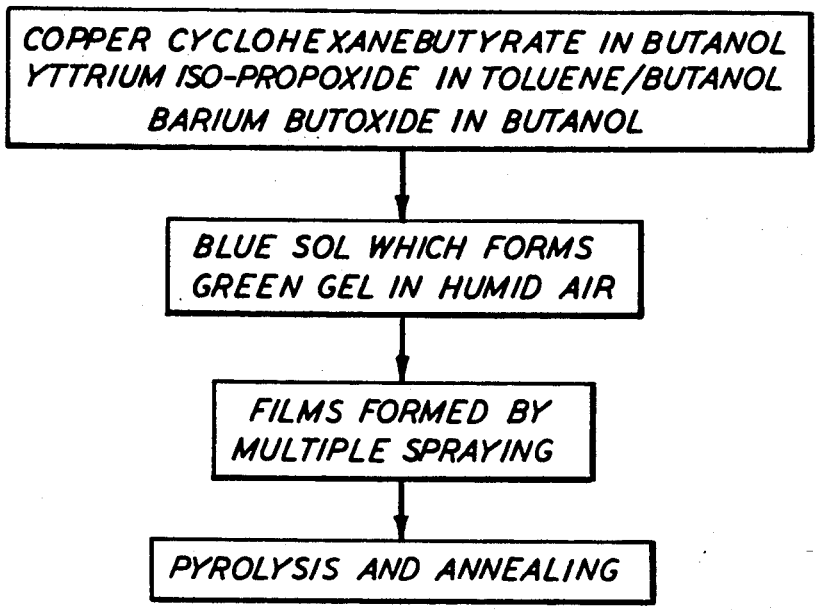
FIG. 3 is a block flow diagram illustrating a specific embodiment of the sol-gel process of the invention.

Referring now to FIG. 3, a block flow diagram which illustrates a preferred method of forming a yttrium-barium-copper oxide superconducting thin film by the process of the invention, the compounds chosen to form the sol, sometimes referred to herein as precursor materials, are copper cyclohexanebutyrate, yttrium iso-propoxide in toluene and barium butoxide. Upon addition of the copper cyclohexanebutyrate to butanol, copper butoxide is formed. Upon addition of yttrium iso-propoxide to butanol, yttrium butoxide is formed. Due to the instability of yttrium iso-propoxide, the butoxide is prepared by replacing toluene with butanol in a solution of yttrium iso-propoxide in toluene.

The copper and yttrium butoxides are mutually soluble with the barium butoxide in butanol to form a solution which converts to a blue sol. This sol subsequently forms a green gel upon being formed into a thin film and exposed to the water vapor present in humid air. As shown in the diagram, the sol may be formed into such a thin film by multiple sprayings of the sol onto a substrate to build up the film thickness. After the film has gelled, it is pyrolyzed or fired in an oxygen-containing atmosphere. Such atmosphere is used to prevent unintended changes in stoichiometry which might otherwise take place in a neutral or reducing atmosphere. Such pyrolysis may be carried out in one or more steps, for example, a first firing in air and a second firing in oxygen in order to increase the amount of the superconducting phase.

As used herein, the term "Oxygen-containing atmosphere" means an atmosphere comprised of at least 10% oxygen, while the term "oxygen atmosphere" means an atmosphere comprised of at least 90% oxygen.

The pyrolyzed film, now in a crystalline superconducting state, may subsequently be subjected to an optional heat treatment in oxygen, referred to herein as "annealing", at a moderate temperature, for example, 400 to 900 degrees C., in order to increase conversion of non-superconducting phases which may be present to the desired superconducting phase.

EXAMPLE

An example of the formation of superconducting oxide thin films by the method of the invention will now be presented in order to further illustrate the various features and advantages thereof.

A solution of yttrium butoxide in butanol was prepared from a solution of yttrium isopropoxide, having the formula $Y[OCH(CH_3)_2]_3$, in toluene having a concentration of 29.5 grams of the propoxide to 100 grams of toluene, by adding an equivalent volume of butanol to the yttrium isopropoxide solution, and distilling off the equivalent volume of the azeotrope of toluene and butanol, and repeating this process until the boiling point of the solution indicated that the toluene had been replaced entirely by butanol. By this technique, a one molar clear solution having a slightly yellow color was obtained.

Next, a solution of barium butoxide in butanol was prepared by adding 8.65 weight percent barium butoxide, having the formula $Ba(C_3H_7O)_2$, to butanol, and subsequently diluting the solution with butanol to obtain a 0.2 molar clear solution having a slightly yellow color.

Next, a 0.1 molar solution of copper alkoxide in butanol was prepared by adding about 4 weight percent copper cyclohexanebutyrate, having the formula $(C_6H_{11}CH_2CH_2CH_2COO)_2Cu$, to butanol. The solution had a turquoise color.

The concentration of these three precursor solutions ranged from about 80 to 90 percent of their solubility limits in butanol at 25° C.

The solutions were then combined in the ratios of 1 milliliter of the yttrium-containing solution, 10 milliliters of the barium-containing solution and 30 milliliters of the copper-containing solution to result in a blue sol having a molar ratio of yttrium to barium to copper of 1:2:3. This molar ratio corresponds to that of the superconducting oxide compound $YBa_2Cu_3O_{6+x}$ located in the ternary system for $Y_2O_3$, BaO and CuO.

Next, a substrate was preheated to about 40 degrees C. prior to forming a film of the sol on the substrate, in order to facilitate even drying and gelling of the film. A sample was then formed by spraying a film of the sol onto the substrate with an air brush. The film thickness was built up by successive applications with the air brush, each application interrupted by a flow of nitrogen across the film for about 5 seconds to facilitate drying. After about six layers were applied in this manner, the accummulated layers were subjected to drying in a microwave oven for about 10 minutes at 100% power. Hydrolysis of the film due to contact with ambient moisture progressed with the removal of the alcohol by evaporation.

The sample comprising the accummulated layers was then air dried for about 10 minutes at about 175 degrees C. in a muffle furnace. Such air drying was observed to improve adhesion of the film to the substrate, particularly at the edges of the film. Following such air drying, the sample was air fired in the same muffle furnace by bringing the temperature from 175 degrees C. to 900 degrees C. at a rate of about 200 degrees C. per minute. This peak temperature was held for about two and one-half minutes after which the fired sample was removed from the furnace by lowering it to a position about 6 inches below the opening in the floor of the furnace. The sample was maintained in this position for about 2 minutes to result in slow cooling to a temperature below 400 degrees C.

Twelve sets of six layers each were applied by this technique. This number of layers results in a thin film having a resistivity of about 200 ohms per centimeter, which was determined empirically to indicate that superconductivity will be achieved upon subsequent firing in oxygen.

The sample was then transferred to a tube furnace for firing, in which a flow of oxygen was maintained. The furnace was brought from room temperature to a peak temperature of about 950 degrees C. at a heating rate of about 10 degrees C. per minute. After a 20 minute period to allow the sample to reach the peak temperature, it was held at this peak temperature for about 10 minutes, following which the furnace was cooled to room temperature at the rate of about 10 degrees C. per minute. Longer holding times at peak temperature, for example, 40 minutes, have been found to improve the superconductivity of the sample.

Figure 4:
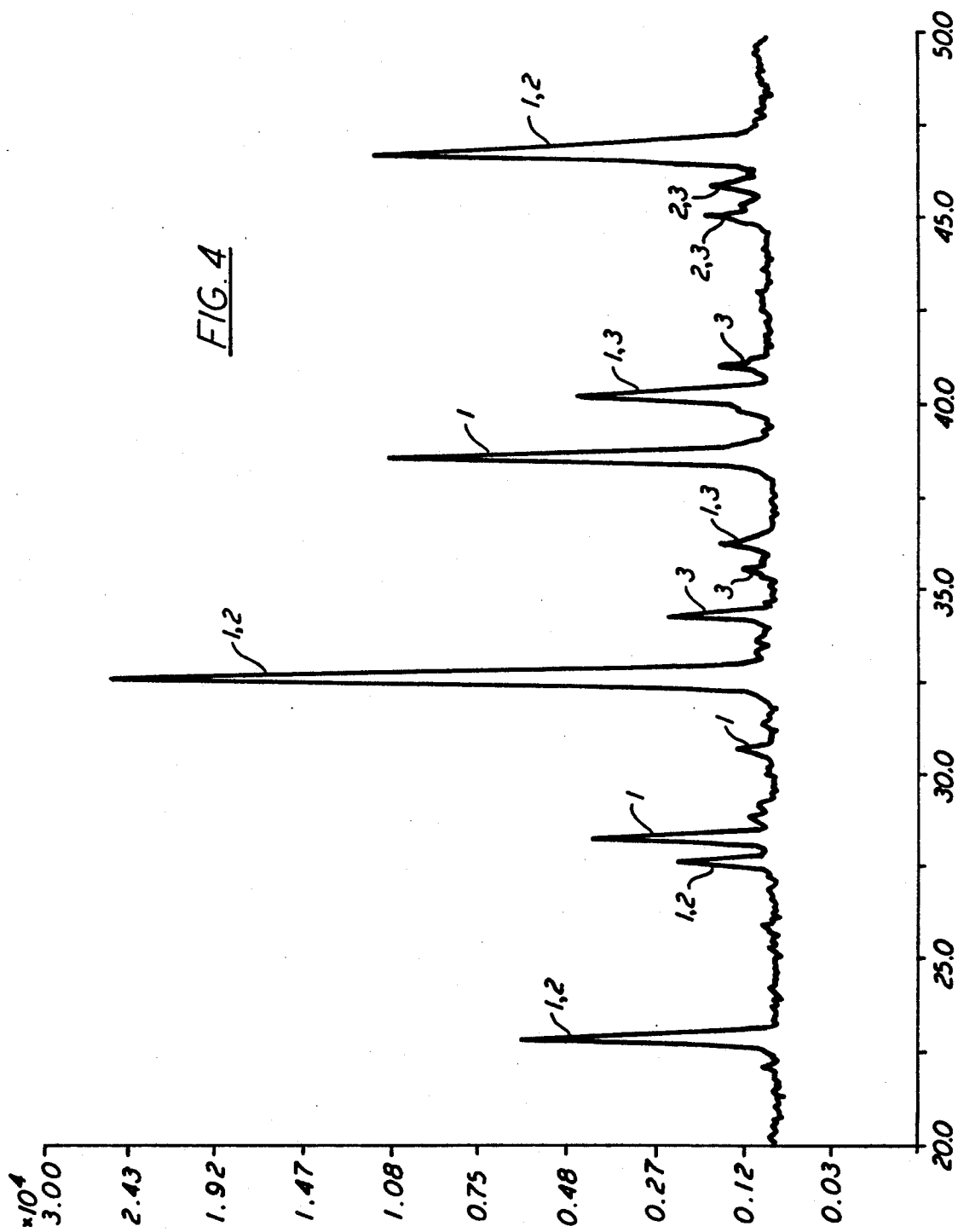
FIG. 4 is an x-ray diffraction pattern of a thin film of the type described in FIG. 3 after oxygen firing, indicating the presence of the superconducting compound $YBa_2Cu_3O_{6+x}$.

X-ray diffraction analysis of the films pyrolyzed in oxygen confirmed the presence of the superconducting compound $YBa_2Cu_3O_{6+x}$. One such x-ray diffraction pattern is shown in FIG. 4, in which the peaks labeled 1 indicate the superconducting compound, while the peaks labeled 2 and 3 indicate other phases $YBa_2Cu_3O_6$ and $BaAl_2O_4$, respectively. Only major peaks are labeled.

Figure 5:
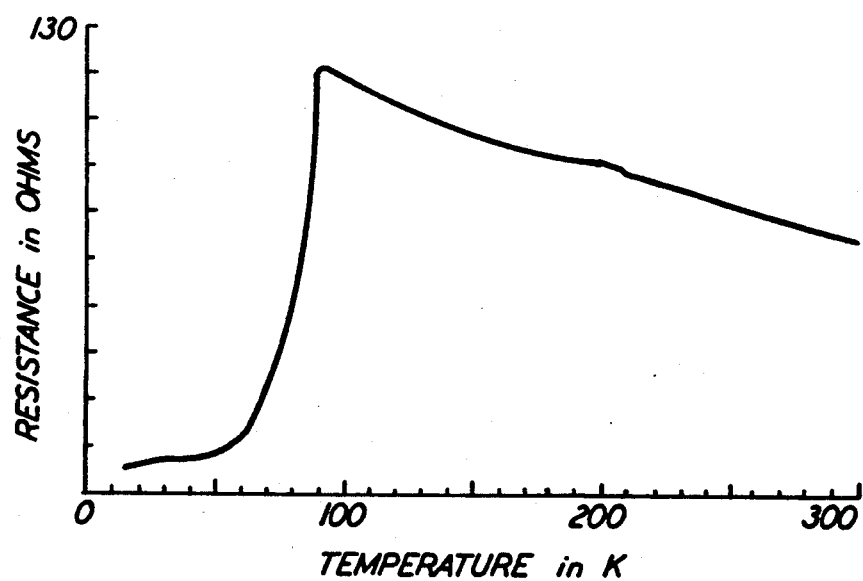
FIG. 5 is a graph of resistance in ohms versus temperature in K of a superconducting film of the type described in FIG. 4, showing transition of the film to a superconducting state.

Resistance versus temperature curves indicating superconductivity were obtained for the samples on various substrate materials including barium titanate, strontium titanate, gallium-gadolinium garnet and sapphire. One such curve, for a film 3 micrometers in thickness on a sapphire substrate, is shown in FIG. 5, where resistance in ohms is plotted versus temperature in K. The transition is seen to occur below about 90° K., with resistance dropping precipitously from about 90° K. to about 65° and approaching zero at about 15° K.

We claim:

1. A method for producing a copper oxide based superconducting oxide composition, the method comprising:
 1) forming a sol from a solution of hydrolyzable alkoxides in a volatile non-polar solvent, the alkoxides being precursors of the desired oxide constituents and being present in the stoichiometric proportions needed to yield the desired superconducting composition, 2) gelling the sol by hydrolysis and polymerization of the alkoxides, and 3) firing the gel in an oxygen-containing atmosphere to convert the gel to a crystalline superconducting oxide.

2. The method of claim 1 in which the non-polar volatile solvent is an alcohol.

3. The method of claim 1 in which gelling is carried out in the presence of water vapor.

4. The method of claim 1 in which the gel is fired at a temperature of from about 700 to 1,000 degrees C.

5. The method of claim 4 in which the firing is carried out in two steps, a first step being carried out in an air atmosphere and a second step being carried out in an oxygen atmosphere.

6. The method of claim 4 in which following firing, the film is heated in an oxygen atmosphere at a temperature of from about 400° to 900° C.

7. The method of claim 1 in which the oxide composition is within the ternary oxide system for A, B and copper oxides, where A is at least one cation selected from the group consisting of yttrium and the rare earths, and B is at least one cation selected from the group of alkaline earths consisting of barium and strontium.

8. The method of claim 7 in which the composition additionally contains fluorine.

9. The method of claim 7 in which the solution of alkoxides is formed by adding A, B and Cu precursor compounds to the solvent.

10. The method of claim 9 in which the solvent is butanol and the copper compound is copper cyclohexanebutyrate.

11. The method of claim 10 in which the A and B compounds are butoxides.

12. The method of claim 11 in which A is yttrium.

13. The method of claim 11 in which B is barium.

14. The method of claim 7 in which the ratio of the precursors in solution results in a molar ratio of A:B:Cu of 1:2:3.

15. The method of claim 1 in which prior to gelling, the sol is formed into a thin film on a substrate.

* * * * *